(12) United States Patent
Sadjadi et al.

(10) Patent No.: US 8,172,980 B2
(45) Date of Patent: May 8, 2012

(54) DEVICE WITH SELF ALIGNED GAPS FOR CAPACITANCE REDUCTION

(75) Inventors: S. M. Reza Sadjadi, Saratoga, CA (US); Zhi-Song Huang, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 908 days.

(21) Appl. No.: 12/202,043

(22) Filed: Aug. 29, 2008

(65) Prior Publication Data

US 2008/0314521 A1    Dec. 25, 2008

Related U.S. Application Data

(62) Division of application No. 11/291,672, filed on Nov. 30, 2005, now Pat. No. 7,432,189.

(51) Int. Cl.
*C23F 1/00* (2006.01)
*H01L 21/306* (2006.01)
*C23C 16/00* (2006.01)

(52) U.S. Cl. ........... 156/345.26; 156/345.43; 118/723 E

(58) Field of Classification Search .................. 118/696, 118/697, 704, 715, 722, 723 R, 723 E; 156/345.24, 156/345.26, 345.43, 345.44, 345.45, 345.46, 156/345.47; 700/95, 117, 121
See application file for complete search history.

(56) References Cited

U.S. PATENT DOCUMENTS

| | | | |
|---|---|---|---|
| 4,871,630 A | 10/1989 | Giammarco et al. | |
| 5,510,645 A | 4/1996 | Fitch et al. | |
| 6,232,214 B1 | 5/2001 | Lee et al. | |
| 6,297,125 B1 | 10/2001 | Nag et al. | |
| 6,605,541 B1 | 8/2003 | Yu | |
| 6,780,753 B2 | 8/2004 | Latchford et al. | |
| 6,781,192 B2 | 8/2004 | Farrar | |
| 6,806,177 B2 | 10/2004 | Strane et al. | |
| 6,846,741 B2 | 1/2005 | Cooney, III et al. | |
| 6,858,153 B2 | 2/2005 | Bjorkman et al. | |
| 6,911,397 B2 | 6/2005 | Jun et al. | |
| 7,008,878 B2 | 3/2006 | Hsu et al. | |
| 2003/0219988 A1 | 11/2003 | Shan et al. | |
| 2003/0232474 A1 | 12/2003 | Lai et al. | |
| 2003/0232509 A1 | 12/2003 | Chung et al. | |
| 2004/0002217 A1 | 1/2004 | Mazur et al. | |
| 2004/0072430 A1 | 4/2004 | Huang et al. | |
| 2004/0126705 A1 | 7/2004 | Lu et al. | |
| 2005/0110145 A1 | 5/2005 | Elers | |
| 2005/0167838 A1 | 8/2005 | Edelstein et al. | |
| 2006/0121721 A1 | 6/2006 | Lee et al. | |
| 2006/0160353 A1 | 7/2006 | Gueneau de Mussy et al. | |

(Continued)

OTHER PUBLICATIONS

Notice of Allowance dated Sep. 24, 2008 from U.S. Appl. No. 11/291,411.

(Continued)

*Primary Examiner* — Maureen Gramaglia
(74) *Attorney, Agent, or Firm* — Beyer Law Group LLP

(57) ABSTRACT

A method for reducing capacitances between semiconductor device wirings is provided. A sacrificial layer is formed over a dielectric layer. A plurality of features are etched into the sacrificial layer and dielectric layer. The features are filled with a filler material. The sacrificial layer is removed, so that parts of the filler material remain exposed above a surface of the dielectric layer, where spaces are between the exposed parts of the filler material, where the spaces are in an area formerly occupied by the sacrificial layer. Widths of the spaces between the parts of the filler material are shrunk with a shrink sidewall deposition. Gaps are etched into the dielectric layer through the shrink sidewall deposition. The filler material and shrink sidewall deposition are removed.

12 Claims, 18 Drawing Sheets

U.S. PATENT DOCUMENTS

| | | |
|---|---|---|
| 2007/0049017 A1 | 3/2007 | Hsieh |
| 2007/0122977 A1 | 5/2007 | Kim et al. |
| 2007/0123016 A1 | 5/2007 | Sadjadi et al. |
| 2007/0123017 A1 | 5/2007 | Sadjadi et al. |

OTHER PUBLICATIONS

Office Action dated Apr. 30, 2008 from U.S. Appl. No. 11/291,303.
Office Action dated Nov. 17, 2008 from U.S. Appl. No. 11/291,303.
Notice of Allowance dated Mar. 20, 2009 from U.S. Appl. No. 11/291,303.
International Search Report dated Apr. 24, 2007 from International Application No. PCT/US2006/044708.
Written Opinion dated Apr. 24, 2007 from International Application No. PCT/US2006/044708.
International Search Report dated Mar. 20, 2007 from International Application No. PCT/US2006/044719.
Written Opinion dated Mar. 20, 2007 from International Application No. PCT/US2006/044719.
Notice of Allowance dated Feb. 19, 2008 from U.S. Appl. No. 11/558,238.
International Search Report dated Mar. 27, 2007 from International Application No. PCT/US2006/044521.
Written Opinion dated Mar. 27, 2007 from International Application No. PCT/US2006/044521.
Office Action dated Dec. 17, 2007 from U.S. Appl. No. 11/291,672.
Notice of Allowance dated May 30, 2008 from U.S. Appl. No. 11/291,672.
Search Report dated Aug. 6, 2009 from Singapore Patent Application No. 200803957-0.
Written Opinion dated Aug. 6, 2009 from Singapore Patent Application No. 200803957-0.
Search Report dated Aug. 6, 2009 from Singapore Patent Application No. 200803956-2.
Written Opinion dated Aug. 6, 2009 from Singapore Patent Application No. 200803956-2.
Search Report dated Aug. 25, 2009 from Singapore Patent Application No. 200803929-9.
Written Opinion dated Aug. 25, 2009 from Singapore Patent Application No. 200803929-9.
Examination Report dated Jun. 9, 2010 from Singapore Patent Application No. 200803957-0.
Office Action dated Sep. 15, 2011 from U.S. Appl. No. 12/341,568.

DEVICE WITH SELF ALIGNED GAPS FOR CAPACITANCE REDUCTION

CROSS REFERENCE TO RELATED APPLICATIONS

This application is a division of prior U.S. patent application Ser. No. 11/291,672 entitled DEVICE WITH SELF ALIGNED GAPS FOR CAPACITANCE REDUCTION, filed on Nov. 30, 2005, now U.S. Pat. No. 7,432,189 issued on Oct. 7, 2008, by inventors Sadjadi et al., which is incorporated herein by reference and from which priority under 35 U.S.C. §120 is claimed.

BACKGROUND OF THE INVENTION

The present invention relates to the formation of semiconductor devices. More particularly, the invention relates to the formation of semiconductor devices with gaps for reducing capacitance.

In semiconductor-based device (e.g., integrated circuits or flat panel displays) manufacturing, dual damascene structures may be used in conjunction with copper conductor material to reduce the RC delays associated with signal propagation in aluminum based materials used in previous generation technologies. In dual damascene, instead of etching the conductor material, vias, and trenches may be etched into the dielectric material and filled with copper. The excess copper may be removed by chemical mechanical polishing (CMP) leaving copper lines connected by vias for signal transmission. To reduce the RC delays even further, porous and non-porous low-k dielectric constant materials may be used. In the specification and claims low-k is defined as k<3.0.

U.S. Pat. No. 6,297,125 discloses the use of air gaps to reduce capacitance.

SUMMARY OF THE INVENTION

To achieve the foregoing and in accordance with the purpose of the present invention a method for reducing capacitances between semiconductor device wirings is provided. A sacrificial layer is formed over a dielectric layer. A plurality of features are etched into the sacrificial layer and dielectric layer. The features are filled with a filler material. The sacrificial layer is removed, so that parts of the filler material remain exposed above a surface of the dielectric layer, where spaces are between the exposed parts of the filler material, where the spaces are in an area formerly occupied by the sacrificial layer. Widths of the spaces between the parts of the filler material are shrunk with a shrink sidewall deposition. Gaps are etched into the dielectric layer through the shrink sidewall deposition. The filler material and shrink sidewall deposition are removed.

In another manifestation of the invention a method for reducing capacitances between semiconductor device wirings is provided. A sacrificial layer is formed over a dielectric layer. A plurality of features are etched into the sacrificial layer and dielectric layer. The features are filled with a filler material. The sacrificial layer is removed, so that parts of the filler material remain exposed above a surface of the dielectric layer, where spaces are between the exposed parts of the filler material, where the spaces are in an area formerly occupied by the sacrificial layer. Widths of the spaces between the parts of the filler material are shrunk with a shrink sidewall deposition. Gaps are etched into the dielectric layer through the shrink sidewall deposition. The filler material and shrink sidewall deposition are removed. The gaps are closed to form pockets from the gaps. The closing the gap comprises a plurality of cycles, where each cycle comprises a bread loaf deposition phase and a bread loaf profile shaping phase. The features are filled with a conductive material.

In another manifestation of the invention an apparatus for reducing capacitances between semiconductor devices for a dielectric layer over which a sacrificial layer has been placed is provided. A plasma processing chamber, comprising a chamber wall forming a plasma processing chamber enclosure, a substrate support for supporting a substrate within the plasma processing chamber enclosure. a pressure regulator for regulating the pressure in the plasma processing chamber enclosure, at least one electrode for providing power to the plasma processing chamber enclosure for sustaining a plasma, a gas inlet for providing gas into the plasma processing chamber enclosure and, a gas outlet for exhausting gas from the plasma processing chamber enclosure is provided. A gas source is in fluid connection with the gas inlet. The gas source comprises a sacrificial layer etchant source, a dielectric layer etchant source, a shrink deposition gas source, and a shrink profile shaping gas source. A controller is controllably connected to the gas source and the at least one electrode. The controller comprises at least one processor and computer readable media. The computer readable media comprises computer readable code for etching features into the sacrificial layer and dielectric layer, wherein the features are subsequently filled with a filler material, computer readable code for removing the sacrificial layer, so that parts of the filler layer remain exposed above a surface of the dielectric layer, wherein spaces are between the exposed parts of the filler material, computer readable code for shrinking widths of the spaces between parts of the filler material with a shrink comprising at least one cycle, wherein each cycle comprises computer readable code for providing a shrink deposition gas from the shrink deposition gas source, computer readable code for generating a plasma from the shrink deposition gas, computer readable code for stopping the shrink deposition gas from the shrink deposition gas source, computer readable code for providing a shrink profile shaping gas from the shrink profile shaping gas source, computer readable code for generating a plasma from the shrink profile shaping gas, and computer readable code for stopping the shrink profile shaping gas from the shrink profile shaping gas source, computer readable code for etching gaps into the etch layer between contact structures through the sidewall deposition, and computer readable code for closing the gaps to form pockets in the gaps.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
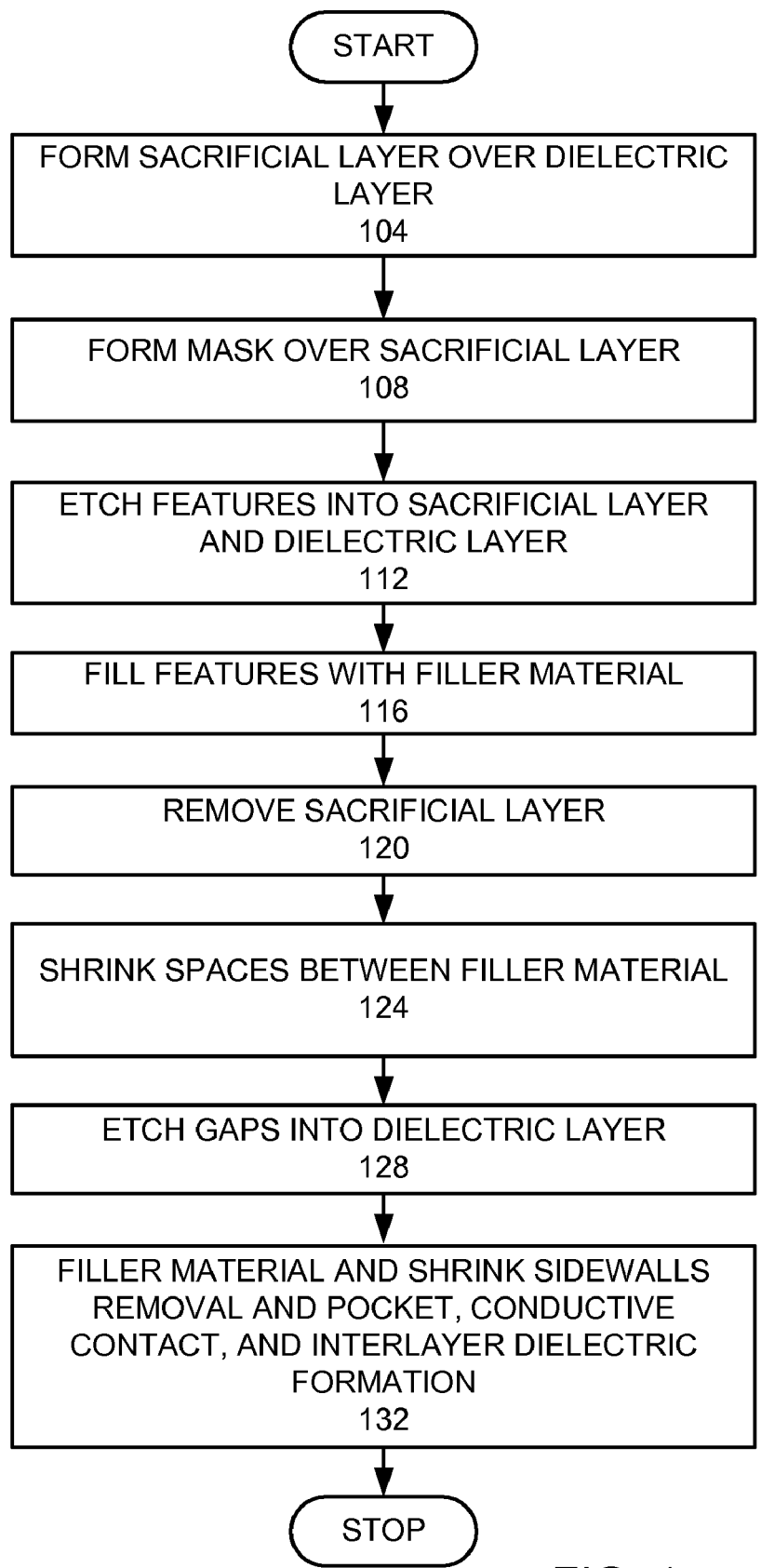
FIG. 1 is a high level flow chart of a process that may be used in an embodiment of the invention.

To facilitate understanding, FIG. 1 is a high level flow chart of a process that may be used in an embodiment of the invention. A sacrificial layer is formed over a dielectric layer (step 104). A mask is formed over the sacrificial layer (step 108). Features are etched into the sacrificial layer and dielectric layer (step 112). Preferably, the etched features are dual damascene features comprising vias and trenches. Preferably, one mask is used to form vias and another mask is used to form trenches. The features are filled with a filler material (step 116). The sacrificial layer is removed (step 120). As a result, part of the filler material extends above the surface of the dielectric layer with spaces between the parts of the filler material extending about the surface of the dielectric layer, wherein the spaces are in the areas formerly occupied by the sacrificial layer. Spaces between the filler material are shrunk (step 124) by forming sidewall depositions on the sides of the filler material, which form shrink sidewalls. Gaps are etched into the dielectric layer (step 128) through the shrunk spaces. The gaps are spaced between the etched features. One or more steps are then used to remove the filler material and shrink sidewalls and to form pockets from the gaps, form conductive contacts in the etched features, and form an interlayer dielectric layer (step 132).

Example

Figure 2A:
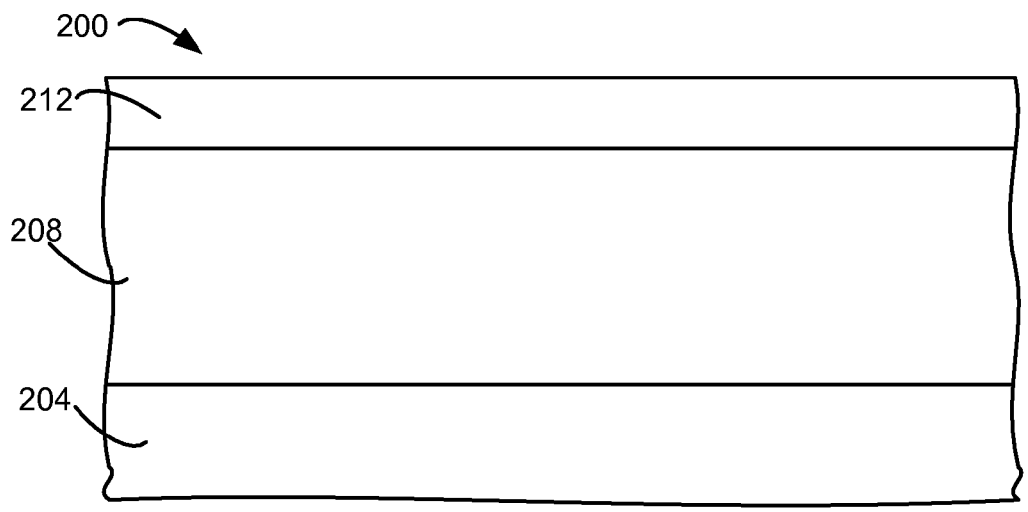
FIGS. 2A-K are schematic cross-sectional and top views of a stack processed according to an embodiment of the invention.

In an example of an embodiment of the invention, a sacrificial layer is formed over a dielectric layer (step 104). FIG. 2A is a cross-sectional view of a sacrificial layer 212 formed over a dielectric layer 208, which is over a substrate 204. In this example, the substrate 204 is a silicon wafer. The dielectric layer 208 is a low-k dielectric, such as organosilicate glass. The sacrificial layer is silicon carbide. In other embodiments, the sacrificial layer is at least one of SiC, SiN, SiOC, H doped SiOC, TiN, TaN, Ti, Ta, Si, and SiO2. More generally, the sacrificial layer is of any material, which may be selectively etched with respect to a filler material and the dielectric material and not to be removed when stripping the mask materials used for forming the said contact structures as described below.

Figure 2B:
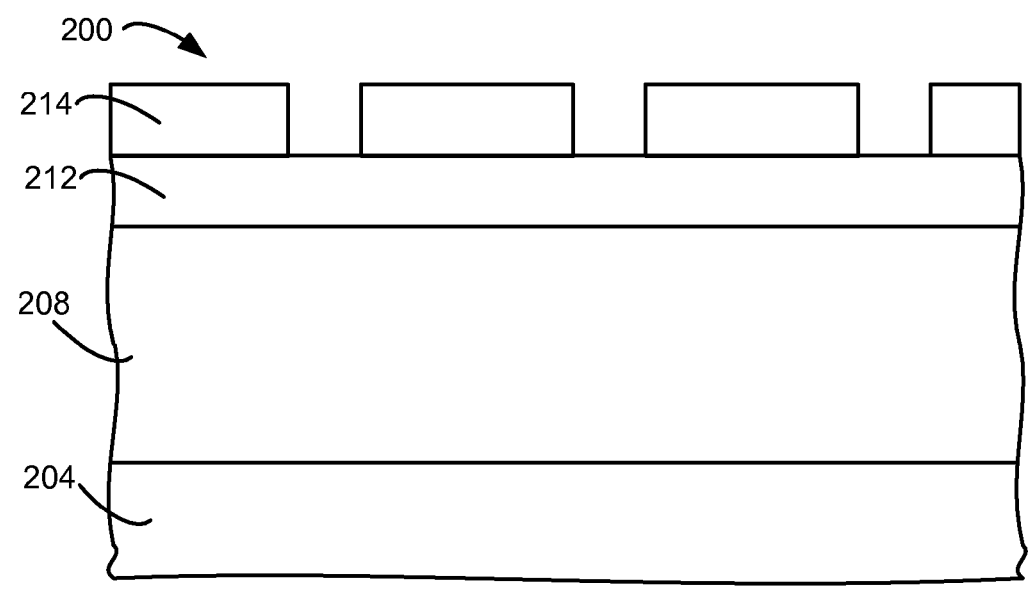
Figure 2C:
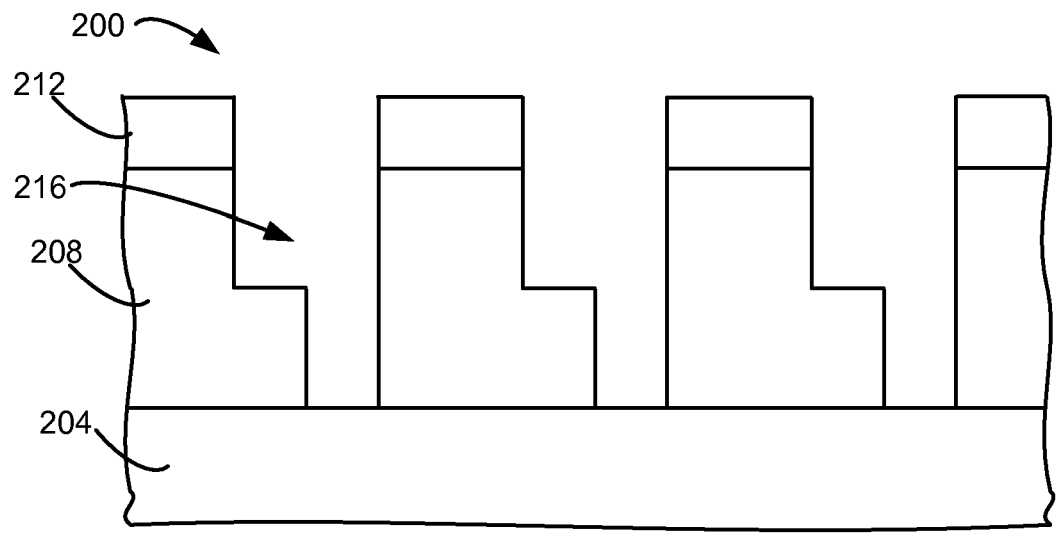

A mask 214 is formed over the sacrificial layer (step 108), as shown in FIG. 2B. Features 216 are etched into the sacrificial layer 212 and the dielectric layer 208 (step 112), as shown in FIG. 2C. In this example, the features 216 are dual damascene features with vias and self aligned trenches, as shown. In one example of forming the dual damascene features the mask 214, shown in FIG. 2B is a via mask. After etching vias the mask 214 is removed and a trench mask is provided for etching trenches.

Figure 2D:
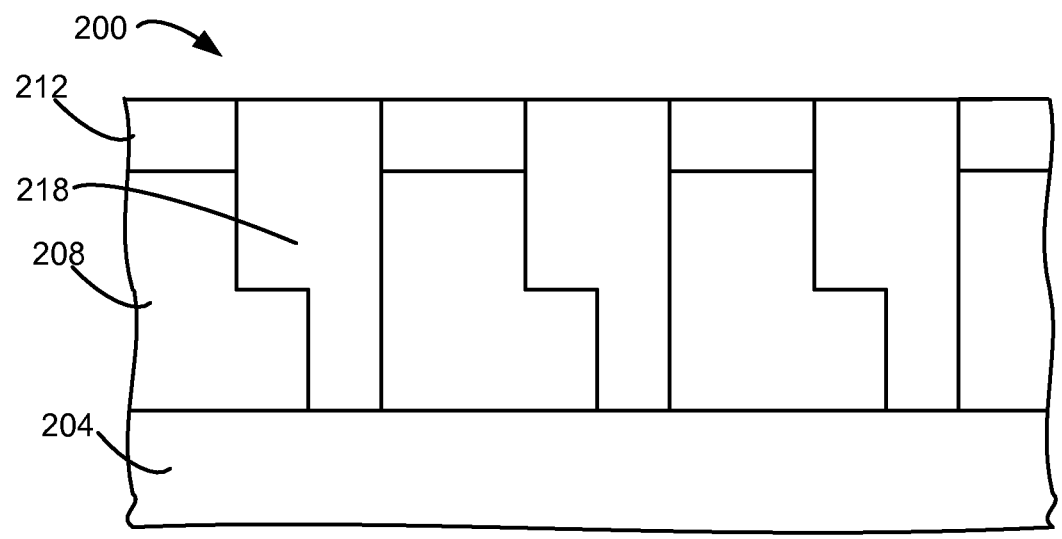

The etched features are filled with a filler material 218 (step 116), as shown in FIG. 2D. The filler material may be photoresist or some other polymer or filler material. In the preferred embodiment, the filler material is selected from at least one of a hydrocarbon, or doped hydrocarbon such as fluorinated hydrocarbons, amorphous Carbon, diamond-like carbon. More generally, the filler material is any material of the form $H_xC_y$, $H_xC_yF_z$, $H_xC_yS_z$ or any combination of C, H, F, Si with various impurities.

Figure 2E:
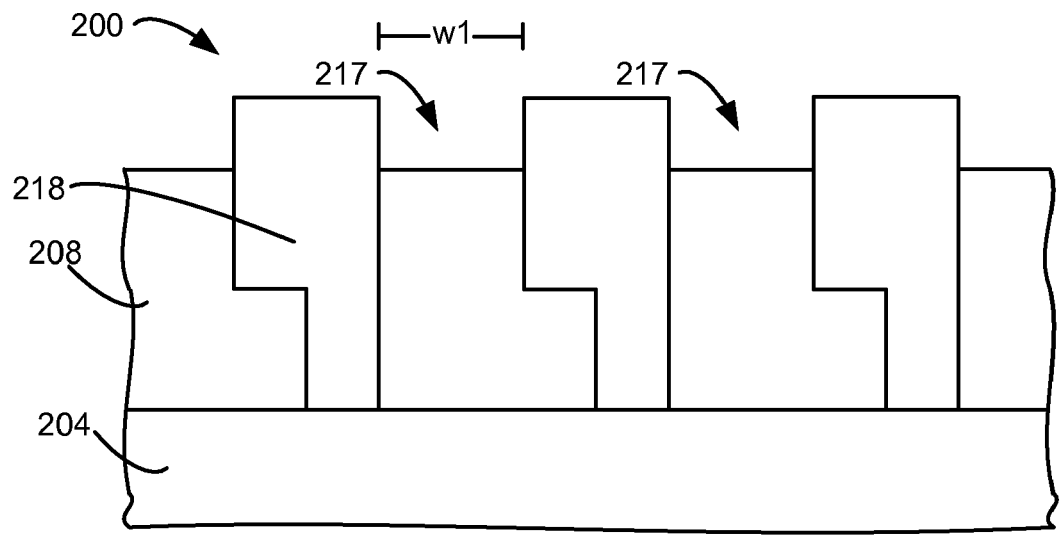

The sacrificial layer is then removed (step 120), as shown in FIG. 2E. As a result of the removal of the sacrificial layer, parts of the filler material 218 extend above the surface of the dielectric layer 208, where spaces 217 are formed between the parts of the filler material 218 that extend above the surface of the dielectric layer 208, where the spaces 217 are in the area formerly occupied by the sacrificial layer. The spaces 217 have widths "w1", as shown in FIG. 2E. To remove the sacrificial layer without removing the filler material 218 or dielectric layer 208, the sacrificial layer must be a material that may be removed without removing the filler material 218 or the dielectric layer 208. For example, the sacrificial layer may be silicon carbide, while the dielectric layer is an organosilicate glass.

Figure 2F:
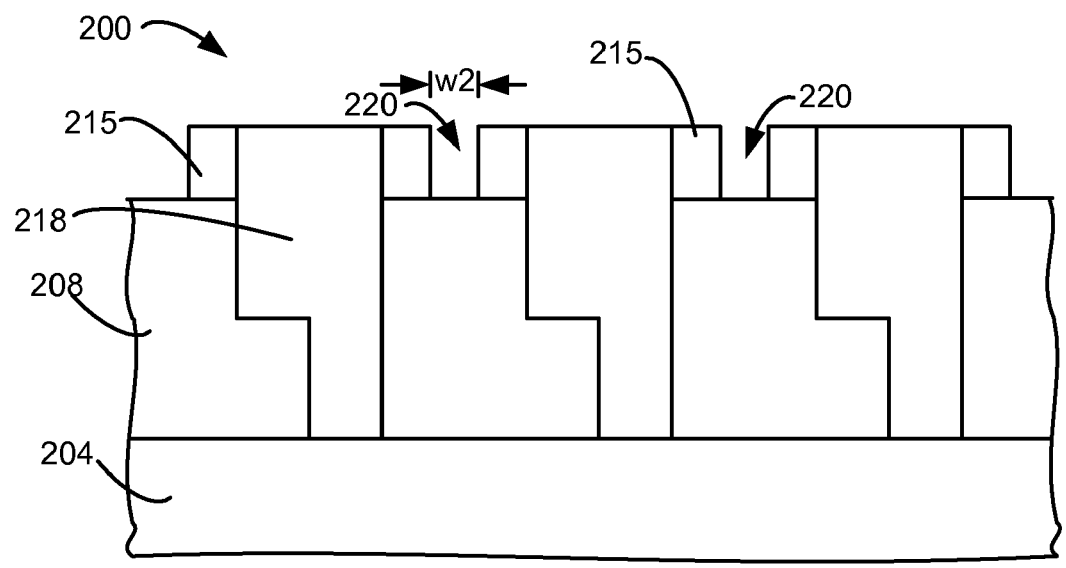

The spaces between the filler material 218 are shrunk (step 112), as shown in FIG. 2F, by forming shrink sidewalls 215 on the sides walls of the exposed filler material 218 to form reduced spaces 220 with reduced widths "w2". The forming the shrink sidewalls 215 to form reduced spaces may be performed by placing the substrate in a processing chamber.

Figure 4:
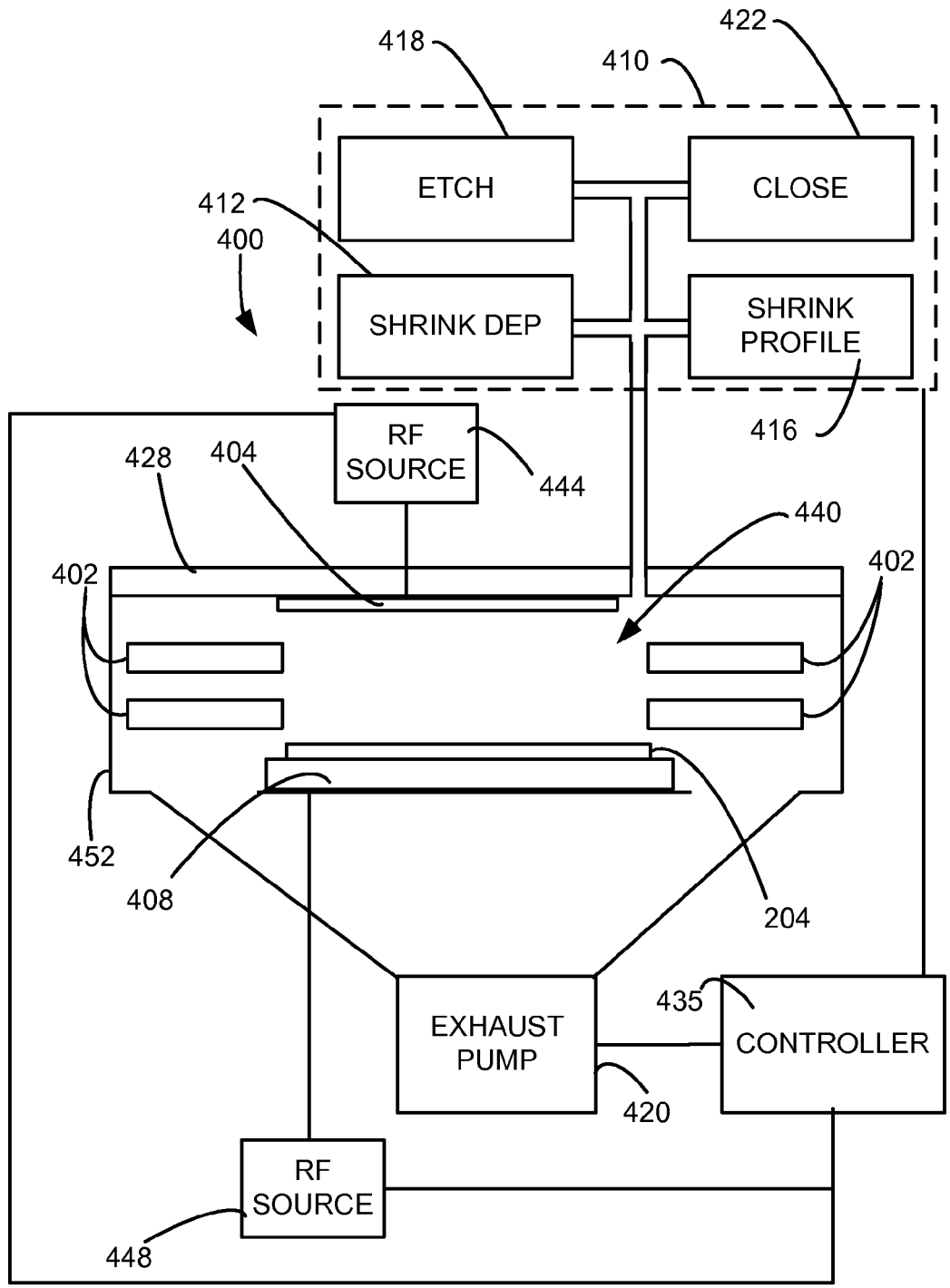
FIG. 4 is a schematic view of a plasma processing chamber that may be used in practicing the invention.

FIG. 4 is a schematic view of a processing chamber 400 that may be used to form the shrink sidewalls. The plasma processing chamber 400 comprises confinement rings 402, an upper electrode 404, a lower electrode 408, a gas source 410, and an exhaust pump 420. The gas source 410 comprises a shrink deposition gas source 412 and a shrink profile gas source 416. The gas source may comprise additional gas sources such as an etch gas source 418 and a gap closure gas source 422 to allow etching, stripping, and gap closing to be done in situ in the same chamber. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410. The DFC System would be used when the layer to be etched 208 is a dielectric layer, such as silicon oxide or organo silicate glass.

Figure 5A:
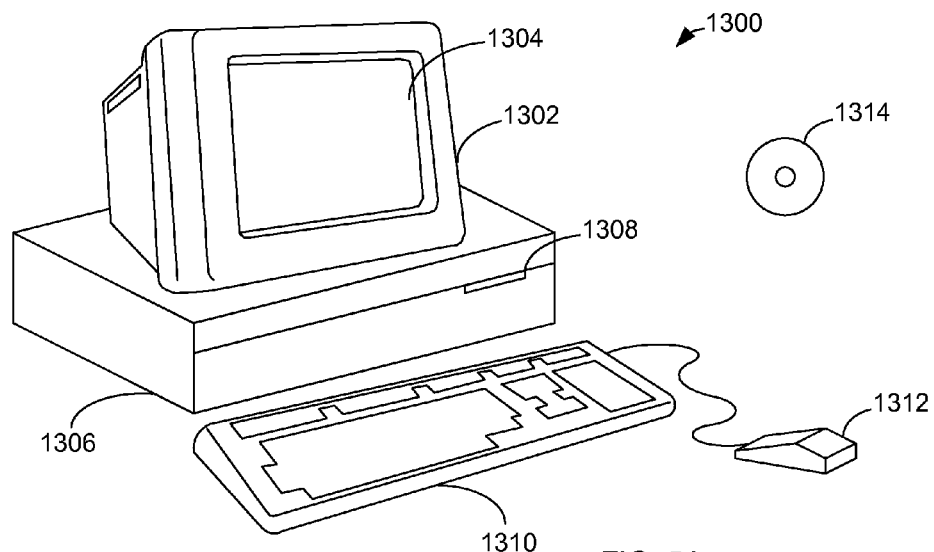
FIGS. 5A-B illustrate a computer system, which is suitable for implementing a controller used in embodiments of the present invention.
Figure 5B:
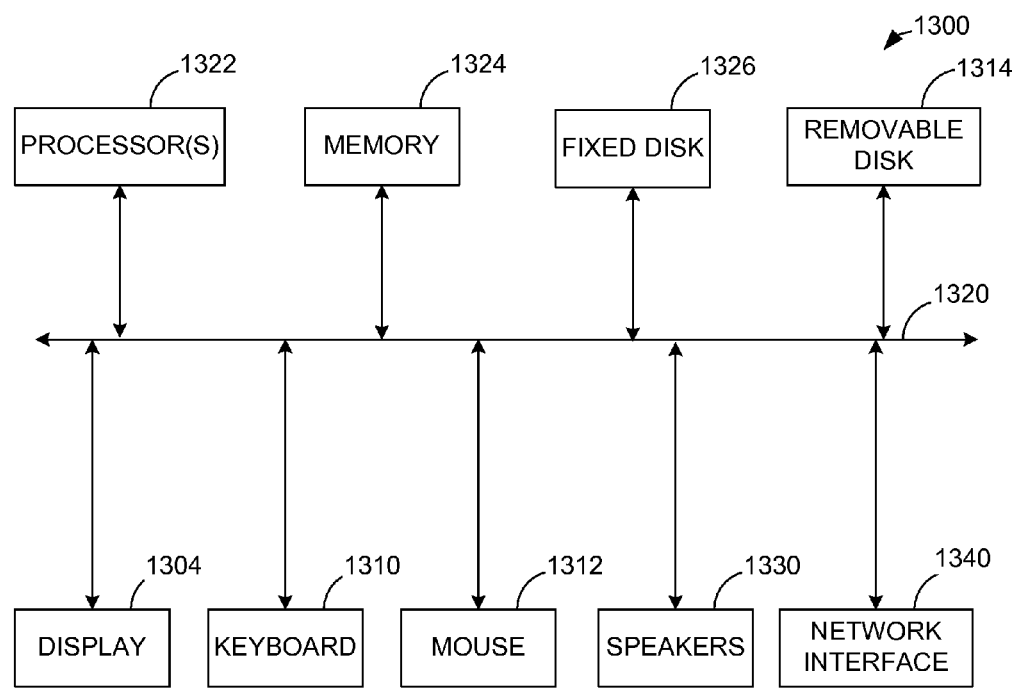

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 3:
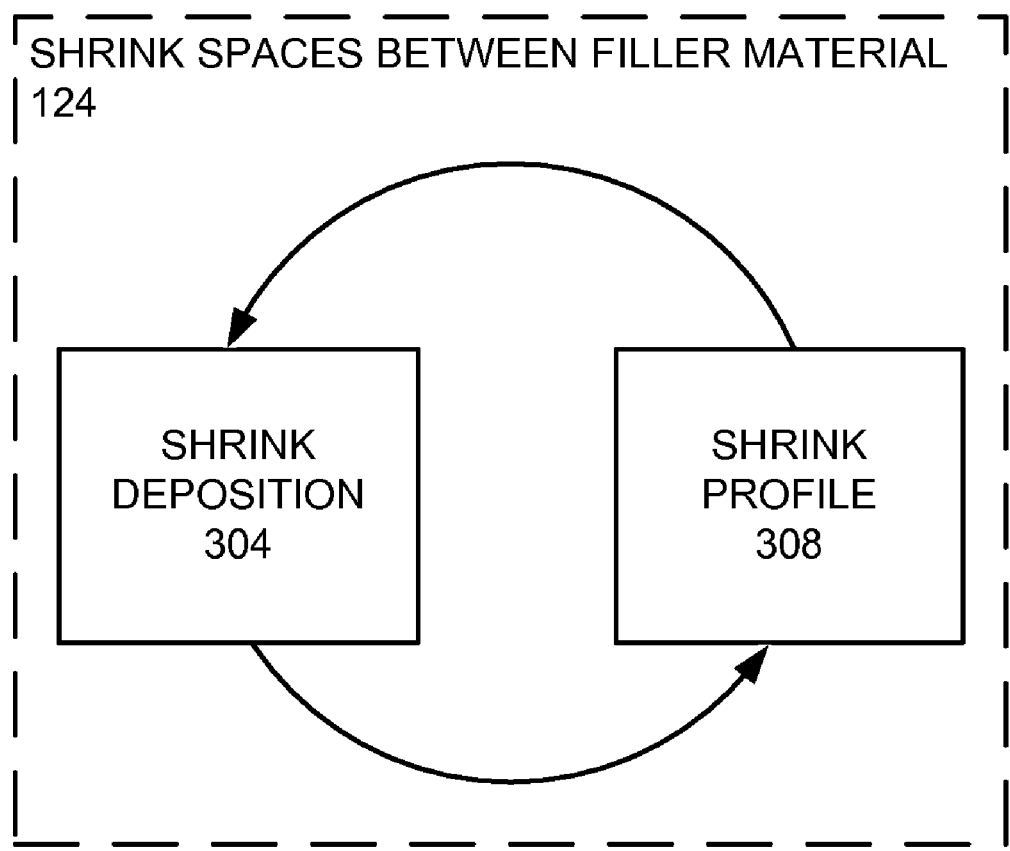
FIG. 3 is a more detailed flow of a step of shrinking spaces.

FIG. 3 is a more detailed flow chart of the step of shrinking the spaces between the filler material 218 (step 124). As shown in FIG. 3, the shrinking the spaces comprises a plurality of cycles of a cyclic process comprising a shrink deposition phase (step 304) and profile shaping phase (step 308).

Preferably, the shrink deposition phase (step 304) uses a deposition gas comprising at least one of a combination of $CF_4$ and $H_2$ or a combination of $CH_3F$ and $N_2$ or $C_xF_y$, or $C_xH_yF_z$ or $C_xH_y$ with an oxidizing or reducing additive such as hydrogen, nitrogen, or oxygen, and carrier gases such as He, Ar, Ne, Kr, Xe etc. More generally, the deposition gas comprises at least one of hydrocarbon, fluorocarbon, and hydrofluorocarbon. More preferably, the deposition gas further comprises a carrier gas, such as argon or xenon. More preferably, the deposition gas further comprises at least one of an oxidizing additive and a reducing additive, such as $O_2$, $H_2$, or $NH_3$.

An example of a shrink deposition phase (step 304) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz. During the deposition phase the deposition gas is provided, the deposition gas is transformed into a plasma, and then the deposition gas is stopped.

Preferably, the shrink profile shaping stage uses a profile shaping gas comprising at least one of $C_xF_y$ and $NF_3$ and $C_xH_y$, and $C_xH_yF_z$. More preferably, the profile shaping gas further comprises a carrier gas, such as argon or xenon. More preferably, the profile shaping gas further comprises at least one of an oxidizing additive and a reducing additive, such as $O_2$, $H_2$, or $NH_3$. As a result, the profile shaping gas is different than the deposition gas.

An example of the shrink profile shaping phase (step 308) provides a halogen (i.e. fluorine, bromine, chlorine) containing hydrocarbon gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz. During the profile shaping phase the profile shaping gas is provided, the profile shaping gas is transformed into a plasma, and then the profile shaping gas is stopped.

Preferably, the process is performed for between 2 to 20 cycles. More preferably, the process is performed between 3 to 10 cycles. The combination of deposition and profile shaping over a plurality of cycles allows for the formation of vertical sidewalls for the shrink. Preferably, the vertical sidewalls are sidewalls that from bottom to top make an angle between 88° to 90° with the bottom of the space.

Preferably, the shrink sidewalls cause widths of the spaces to be reduced by between 5-80%. More preferably, the shrink sidewalls cause the widths of the spaces to be reduced by between 5-50%. The cyclical cycle may have additional deposition and/or shaping phases or may have other additional phases.

Figure 2G:
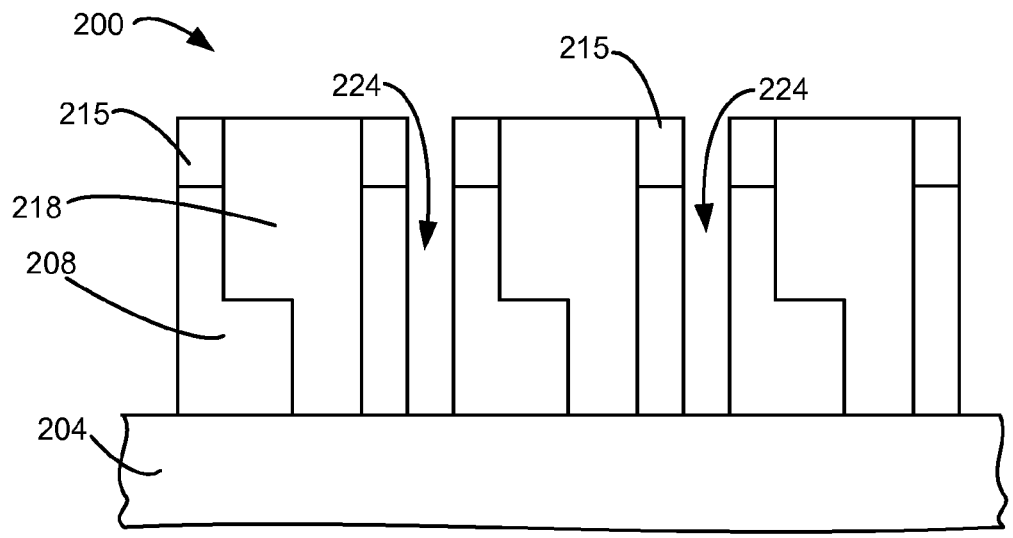

Gaps are etched into the dielectric layer 208 through the reduced spaces between the shrink sidewalls 215 to form gaps 224, as shown in FIG. 2G. A conventional etch recipe for etching the dielectric layer 208 is used.

Figure 6:
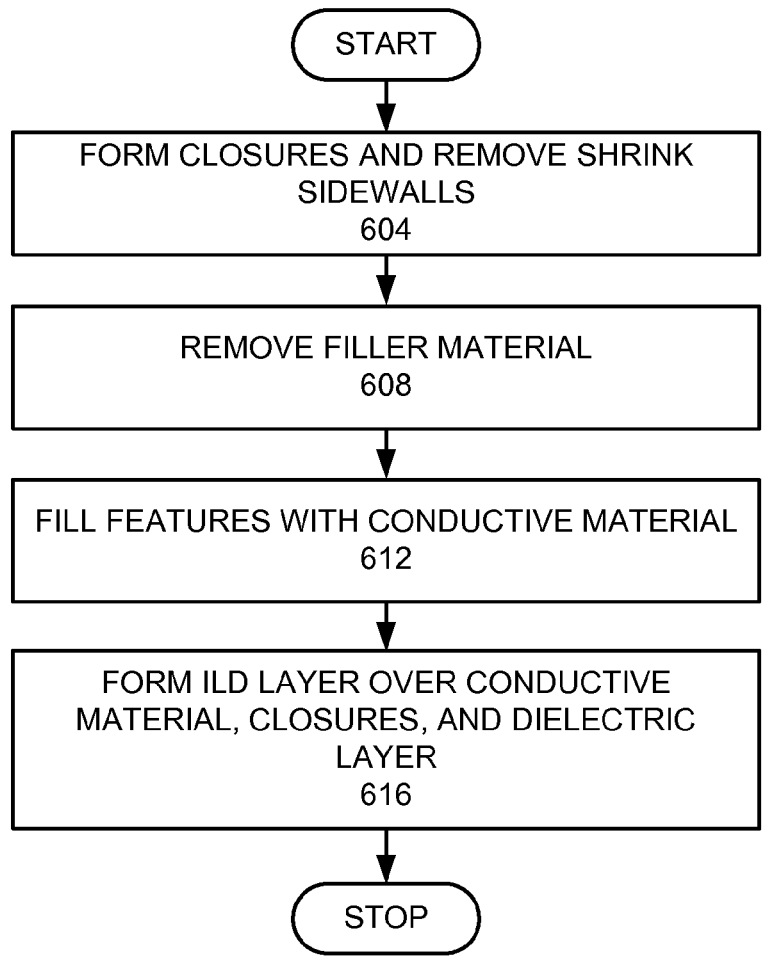
FIG. 6 is a more detailed flow chart of the one or more steps that are used to remove the filler material and shrink sidewalls and to form pockets from the gaps, form conductive contacts in the etched features, and form an interlayer dielectric layer.

One or more steps are then used to remove the filler material and shrink sidewalls and to form pockets from the gaps, form conductive contacts in the etched features, and form an interlayer dielectric layer (step 132). FIG. 6 is a more detailed flow chart of the one or more steps that are then used to remove the filler material and shrink sidewalls and to form pockets from the gaps, form conductive contacts in the etched features, and form an interlayer dielectric layer (step 132).

Figure 2H:
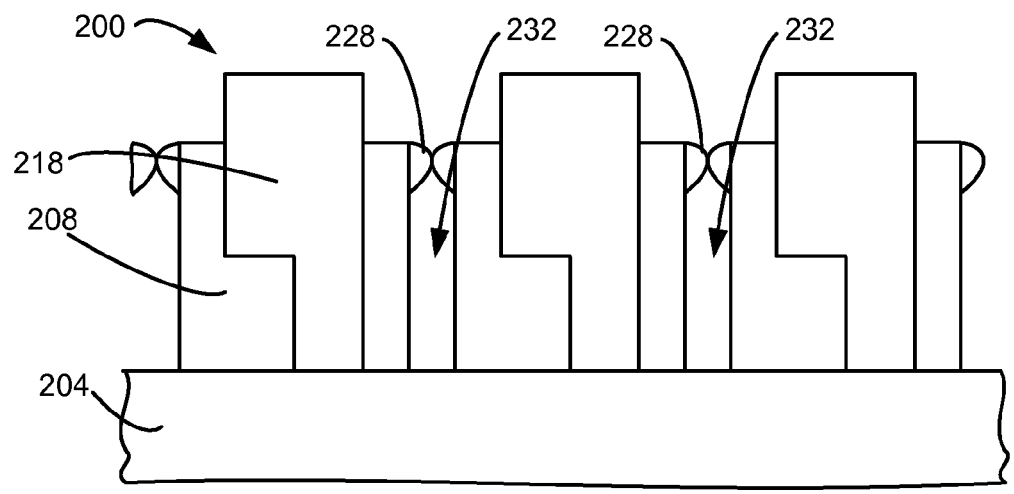

In this example, closures 228 are formed and the deposited sidewalls are removed (step 604), as shown in FIG. 2H to form pockets 232. In this example, the pockets are filled with air to lower the dielectric constant. The pockets 232 may be filled with various gases so that they are gas filled, which are called gas pockets. More generally, the pockets may be filled with a fluid, such as a gas or liquid. The volume of each pocket 232 is almost equal to the volume of the gap in which the pocket is located, and at least half the volume of the gap in which the pocket is located.

Figure 7:
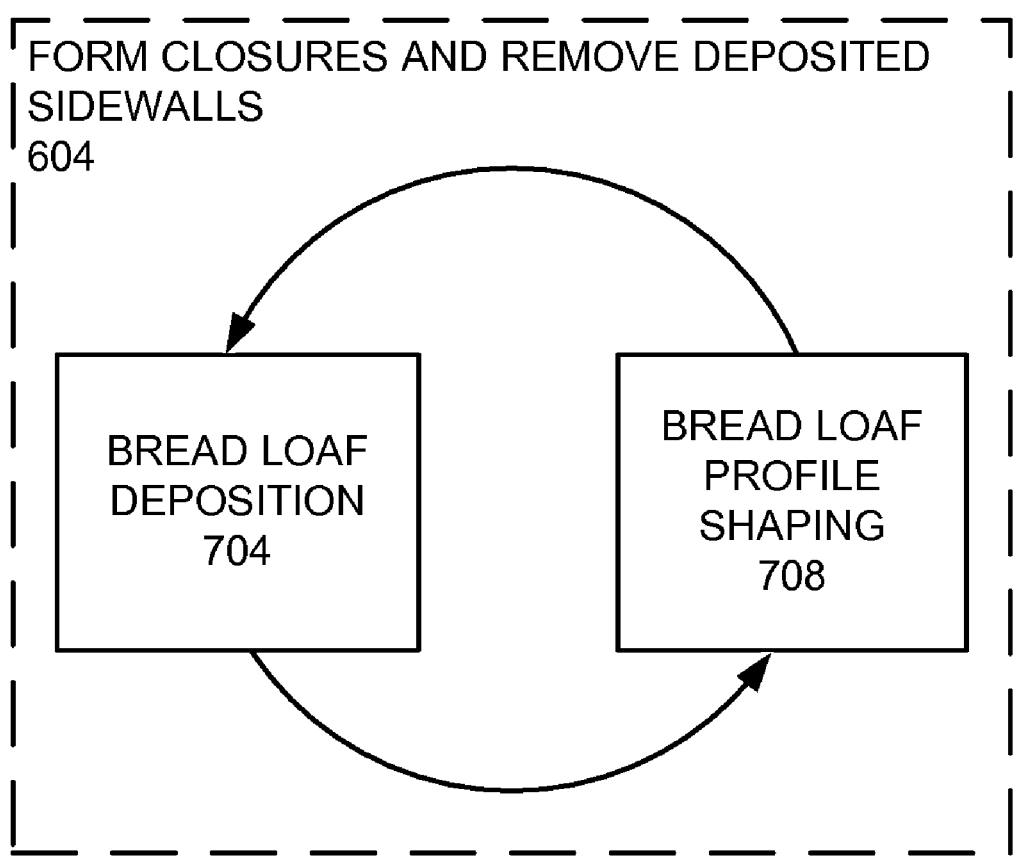
FIG. 7 is a more detailed view of a multiphase cyclical process for the step of forming the bread loaf closures while removing the shrink sidewalls.

FIG. 7 is a more detailed view of a multiphase cyclical process for the step of forming the bread loaf closures while removing the shrink sidewalls (step 604). A bread loaf deposition phase (step 704) is performed. This phase provides a deposition on sidewalls of the gaps. During the deposition phase a deposition gas is provided, a plasma is formed from the deposition gas, and then the deposition gas is stopped. A bread loaf profile shaping phase (step 708) is then provided. This phase shapes the profile of the deposition to form bread loaf closures. During the bread loaf profile shaping phase a bread loaf profile shaping gas is provided, a plasma is formed from the bread loaf profile shaping gas, then the bread loaf profile shaping gas is stopped. In addition, this phase is used to remove the shrink sidewalls. Preferably, this cycle is repeated from 3 to 20 times. The multiphase and multiple cycle process is able to provide a bread loaf closure in the gap below the top surface of the dielectric layer.

In this embodiment, the deposited sidewalls 215 are removed when the closures 228 are formed. The advantage of forming the bread loaf closures while removing the shrink sidewalls avoids a subsequent shrink sidewall removal, which could damage the bread loaf closures. However, other embodiments may remove the shrink sidewalls separately through a process that does not damage the bread loaf closures, such as using a CMP process.

It is desirable to form the bread loaf closure in the gap, so that the closure is below the top surface of the etch layer. One advantage of this is that a subsequent CMP process will not damage such closures. It is believed that a multiphase and/or multiple cycle process is an advantageous process for forming such closures in the gap.

Figure 2I:
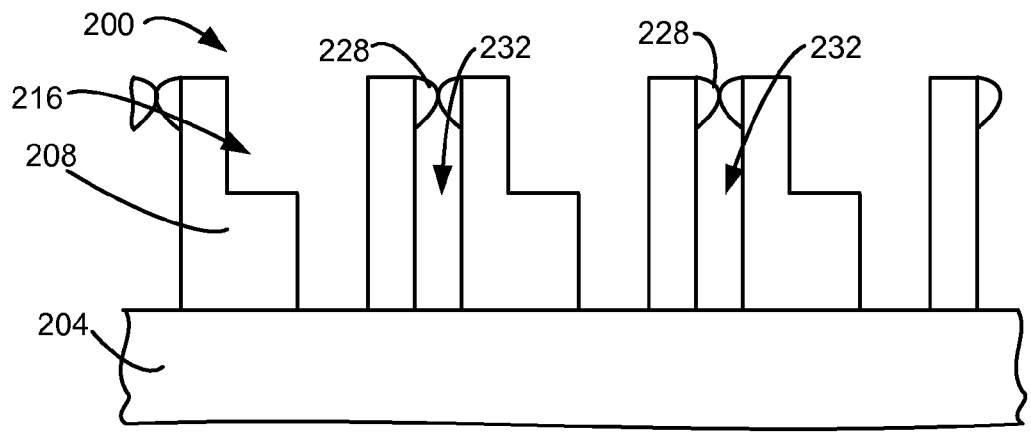
Figure 2J:
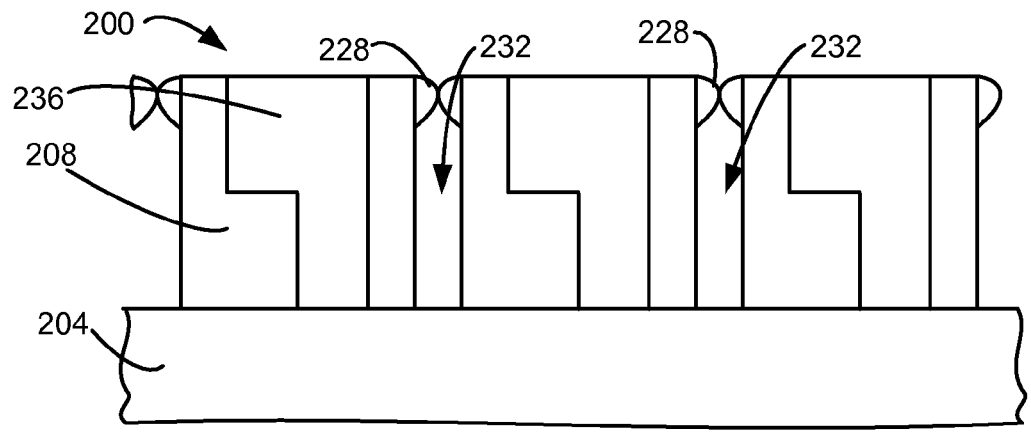

The filler material is then removed (step 608), as shown in FIG. 2I. A conventional ashing process may be used to remove the filler material. The etched features are filled with a metallic material 236 (step 612), such as copper, to form metal contacts, using conventional metal filling processes, as shown in FIG. 2J. The bread loaf closures prevent the metallic material from filling the pockets 232.

The table below provides various combinations of sacrificial layer materials and filler materials. Duo is a hydrocarbon material with silicon. The organic polymer may be amorphous carbon, photoresist, or bottom antireflective coating (BARC). The combinations allow the sacrificial layer to be selectively removed with respect to the filler material and dielectric layer using either a plasma etch or wet strip and the filler material to be selectively removed with respect to the dielectric layer using an oxidizing, reducing, or wet strip.

| Sacrificial materials | Filler materials |
|---|---|
| SiN | Organic Polymer or TEOS |
| a-Si | Organic Polymer |
| TEOS | Organic Polymer |
| Duo | Organic Polymer |
| SiC | Organic Polymer |
| a-Si | Duo |
| TiN | Organic Polymer |
| TaN | Organic Polymer |

Figure 2K:
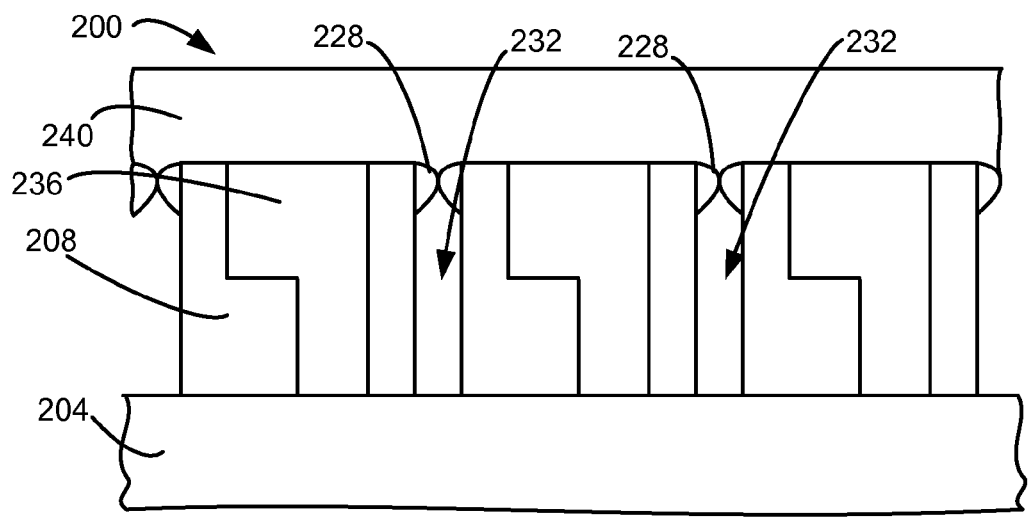

An interlayer dielectric (ILD) 240 is formed over the dielectric layer 208, contacts, and bread loaf closures 228 (step 616), as shown in FIG. 2K. Conventional methods of forming the ILD, such as spin on or CVD may be used.

This process allows for alignment of the pockets with the features. The feature shrink process allows the formation of pockets that have critical dimensions that are smaller than critical dimensions of the lithography process used. In this example, the trench width is the minimum critical dimension possible for the lithographic process used. The shrink process allows for a further reduction of the critical dimensions of the feature size. Without the shrink, the etching of the gap may allow the contact structure to be exposed to the etching of the gap, which would damage the contact structure.

In addition, this process allows the dielectric to be one of many different dielectric materials, wherein the process disclosed in U.S. Pat. No. 6,297,125 is limited regarding the dielectric materials that can be used and requires a barrier layer to protect the contact, which may increase the dielectric constant.

Figure 8A:
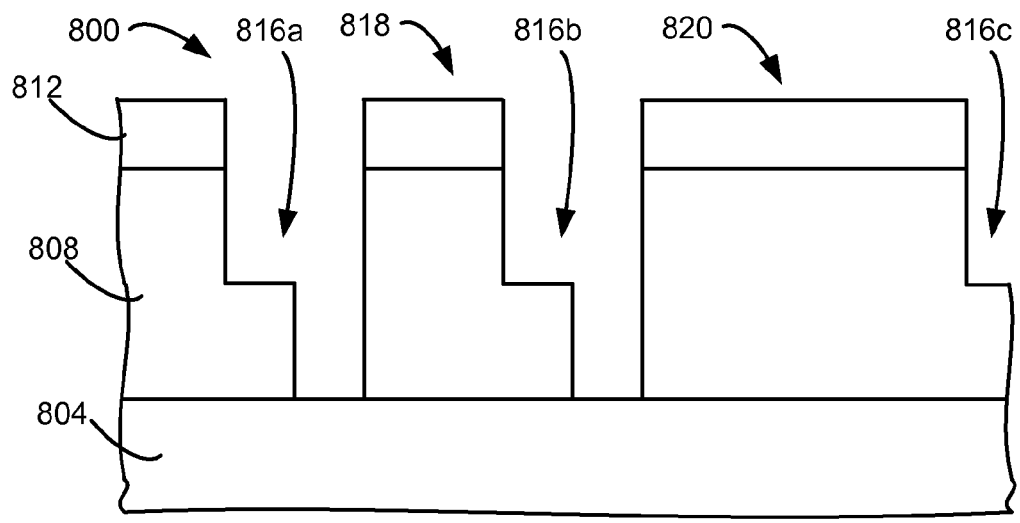
FIGS. 8A-D are schematic cross-sectional views of a stack with wide and narrow spaces.

In processes where the contacts are separated by a large distance, additional steps may be required. FIG. 8A is a cross-sectional view of a stack 800 with sacrificial layer 812 formed over a dielectric layer 808, which is over a substrate 804, into which dual damascene features have been etched. A thin space 818 is between a first dual damascene feature 816a and a second dual damascene feature 816b. A wide space 820 is between the second dual damascene feature 816b and a third dual damascene feature 816c.

Figure 8B:
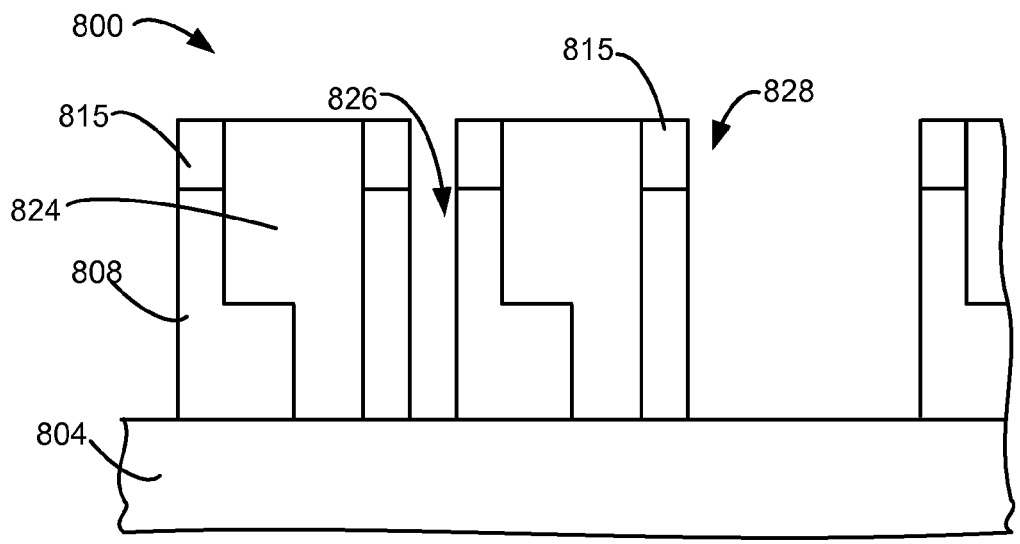

FIG. 8B is a cross-sectional view of the stack 800 after the dual damascene features have been filled with a filler material 824, the sacrificial layer has been removed, shrink sidewalls 815 have been formed, and gaps have been etched. In the areas of the regular spaces, narrow gaps 826 have been formed. In the area where there was a wide space a wide gap 828 has been formed.

Figure 8C:
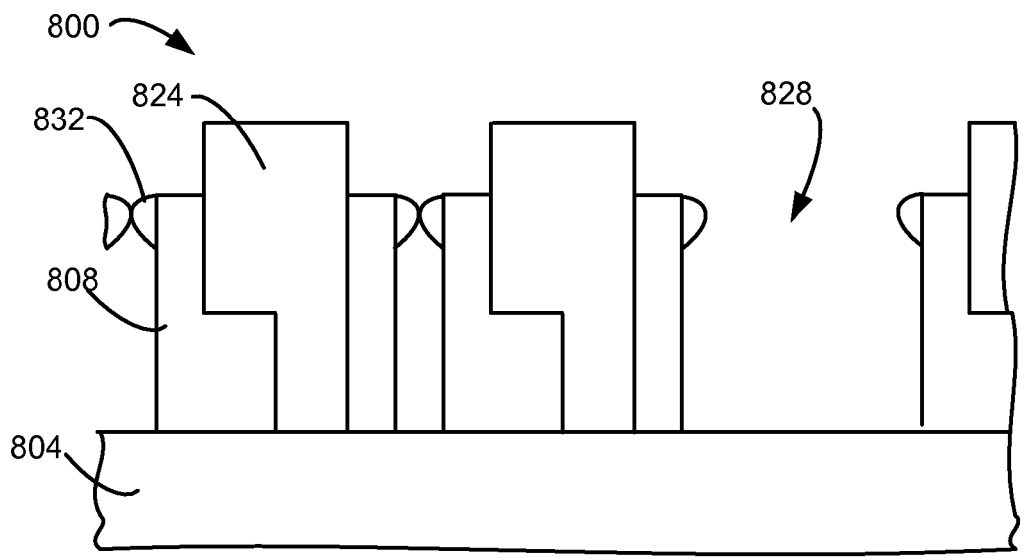

FIG. 8C is a cross-sectional view of the stack 800 after closures 832 are formed and the shrink sidewalls are removed. Because the wide gap 828 is so wide, the closures 832 do not close the wide gap 820.

Figure 8D:
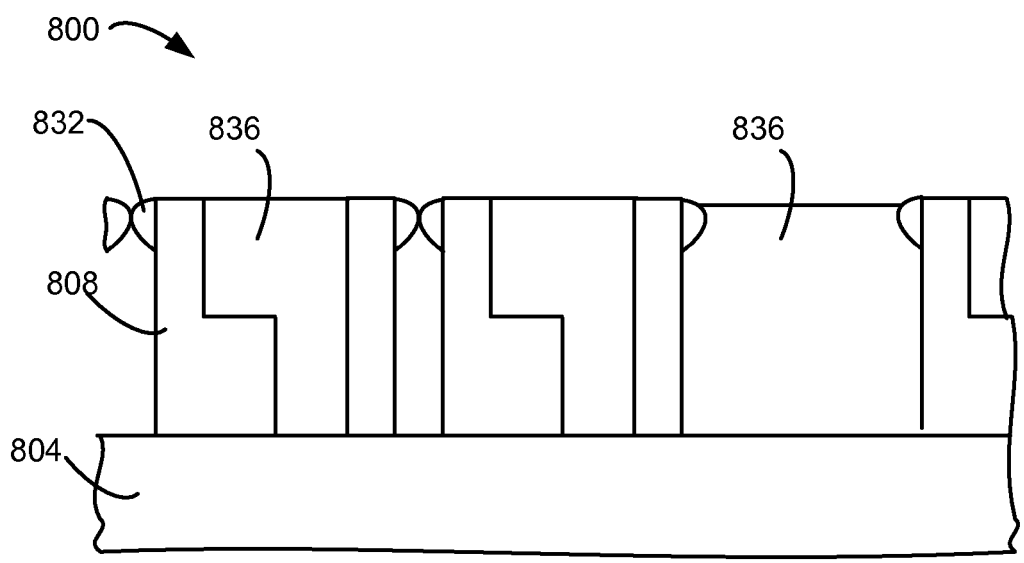

FIG. 8D is a cross-sectional view of the stack 800 after the filler material is removed and the dual damascene features are filled with a conductive material 836. Because a the wide gap has not been closed, in the conductive material fills the wide gap, which is not desired.

Various additional steps may be used to prevent the formation of a wide gap filled with conductive material.

Figure 9A:
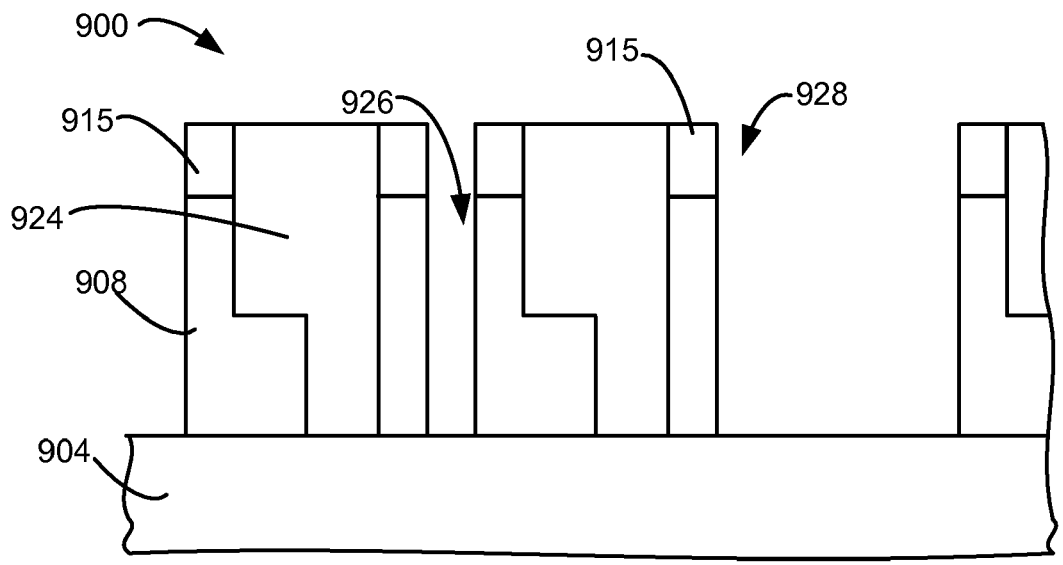
FIGS. 9A-B are schematic cross-sectional views of a stack with wide and narrow spaces in another embodiment of the invention.

FIG. 9A is a cross-sectional view of the stack 900 after the dual damascene features have been filled with a filler material 924, the sacrificial layer has been removed, shrink sidewalls 915 have been formed, and gaps have been etched into the dielectric layer 908 over the substrate 904. In the areas of the regular spaces, narrow gaps 926 have been formed. In the area where there was a wide space a wide gap 928 has been formed.

Figure 10:
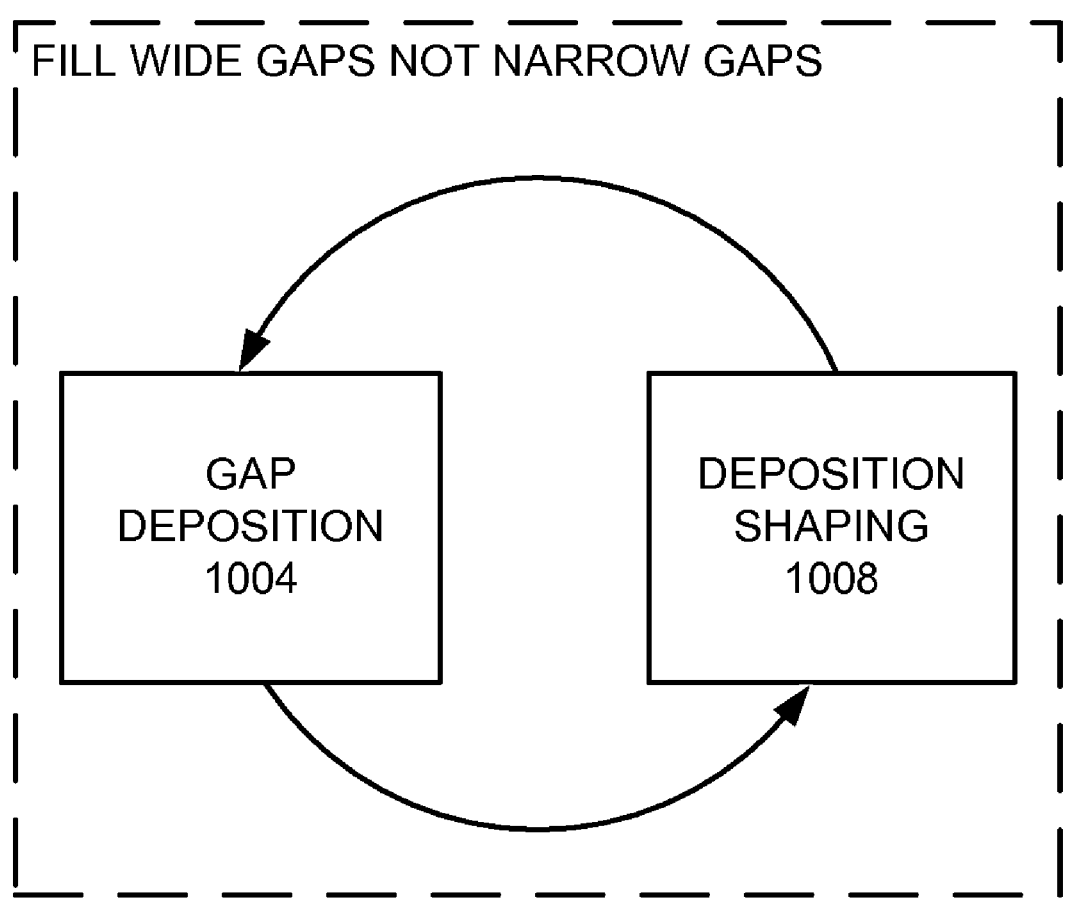
FIG. 10 is a multiphase cyclical process filling wide gaps but not narrow gaps.

A cyclical deposition process is used that selectively fills wide gaps 928, while not filling narrow gaps 926. FIG. 10 is a flow chart of a cyclical deposition process that is used to fill the wide gaps 928 without filling the narrow gaps 926. A gap deposition phase 1004 deposits material in the gaps (step 1004). A gap deposition shaping phase shapes the deposit so that no net deposit occurs in the narrow gap while a deposition remains in the wide gap (step 1008).

Preferably, the gap deposition phase (step 1004) uses a deposition gas comprising at least one of a combination of $CF_4$ and $H_2$ or a combination of $CH_3F$ and $N_2$ or $C_xF_y$ or $C_xH_yF_z$ with an oxidizing or reducing additive such as hydrogen, nitrogen, or oxygen, and carrier gases such as He, Ar, Ne, Kr, Xe etc. More generally, the deposition gas comprises at least one of hydrocarbon, fluorocarbon, and hydrofluorocarbon. More preferably, the deposition gas further comprises a carrier gas, such as argon or xenon. More preferably, the deposition gas further comprises at least one of an oxidizing additive and a reducing additive, such as $O_2$, $H_2$, or $NH_3$.

Preferably, the gap deposition shaping phase (step 1008) uses a deposition shaping gas comprising at least one of $C_xF_y$ and $NF_3$ and $C_xH_yF_z$. More preferably, the deposition shaping gas further comprises a carrier gas, such as argon or xenon. More preferably, the profile shaping gas further comprises at least one of an oxidizing additive and a reducing additive, such as $O_2$, $H_2$, or $NH_3$.

Figure 9B:
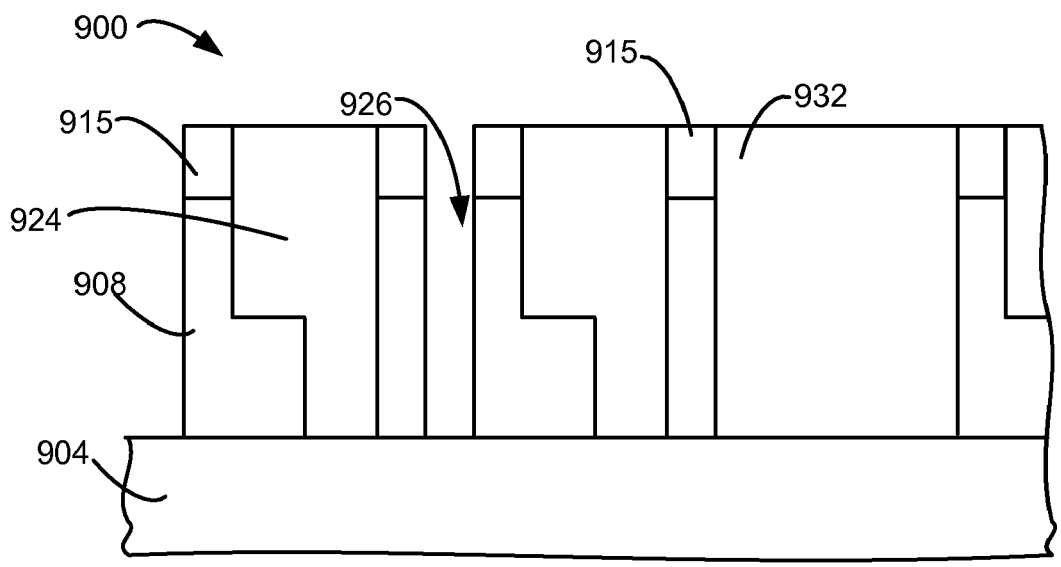

FIG. 9B is a cross sectional view of the stack after the cyclical deposition process is complete. The wide gap has been filled with a deposition 932, while the narrower gaps have not been filled. The filler material 924 is removed and the dual damascene features are filled with a conductive material. The deposition 932 keeps the conductive material out of the wide gap.

In one embodiment the deposition 932 may be left in the wide gap to act as a dielectric in the final product. The deposition would then be chosen to be low-K material. In another embodiment, the deposition 932 may be removed and the wide gap closed by the subsequent ILD layer to form a wide pocket.

Figure 11A:
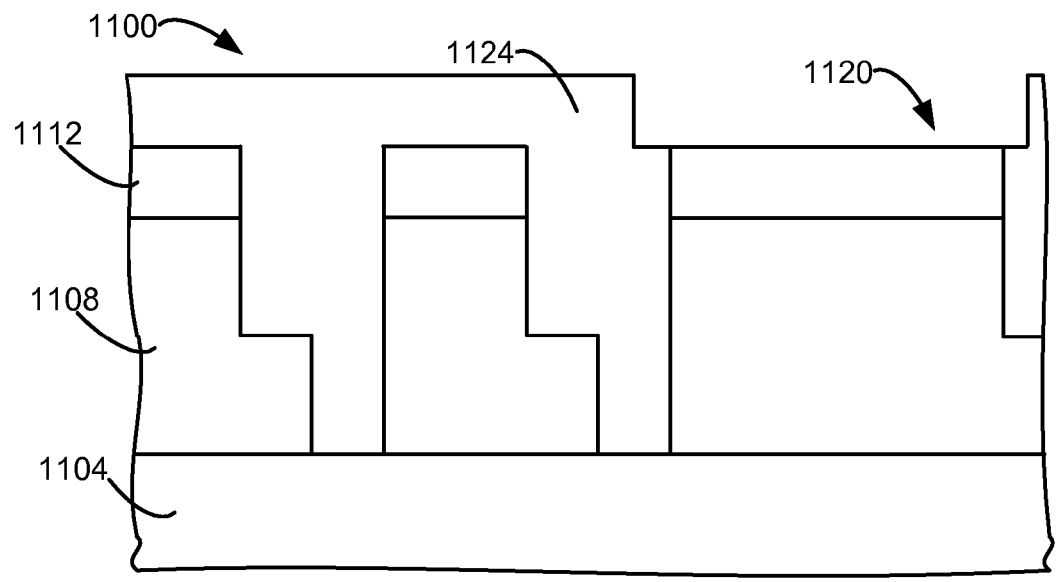
FIGS. 11A-D are schematic cross-sectional views of a stack with wide and narrow spaces in another embodiment of the invention.
Figure 11B:
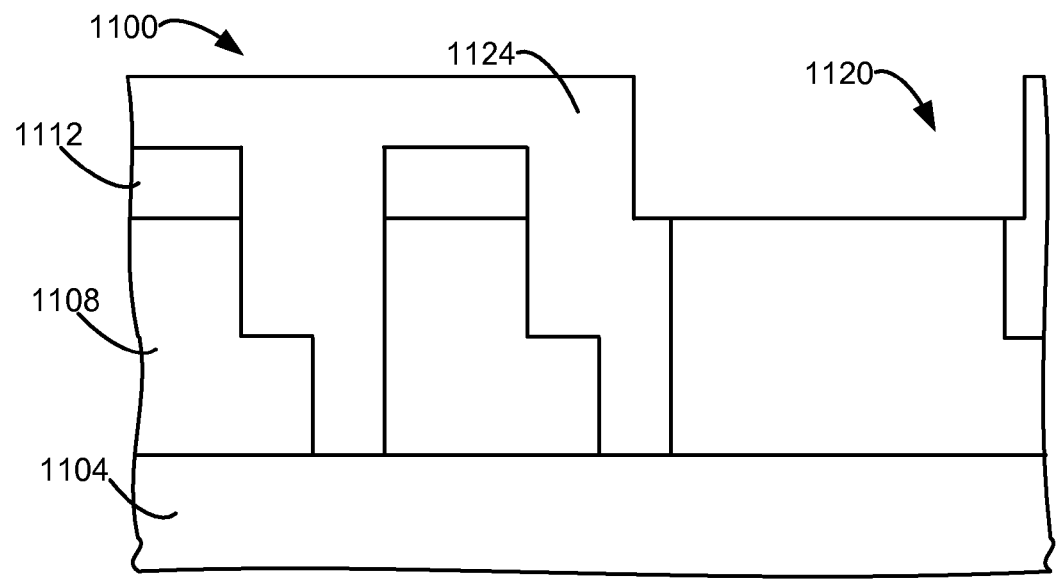
Figure 11C:
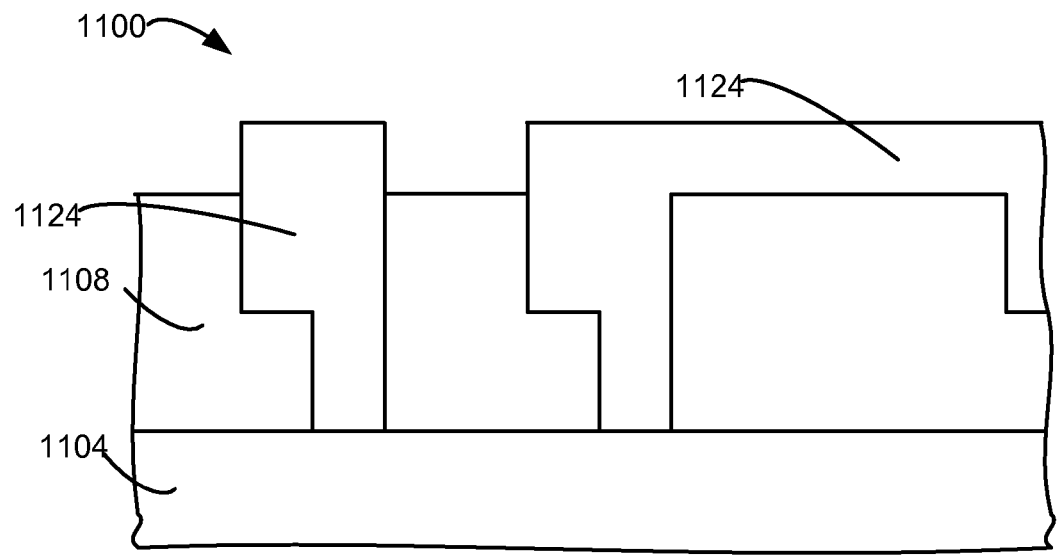
Figure 11D:
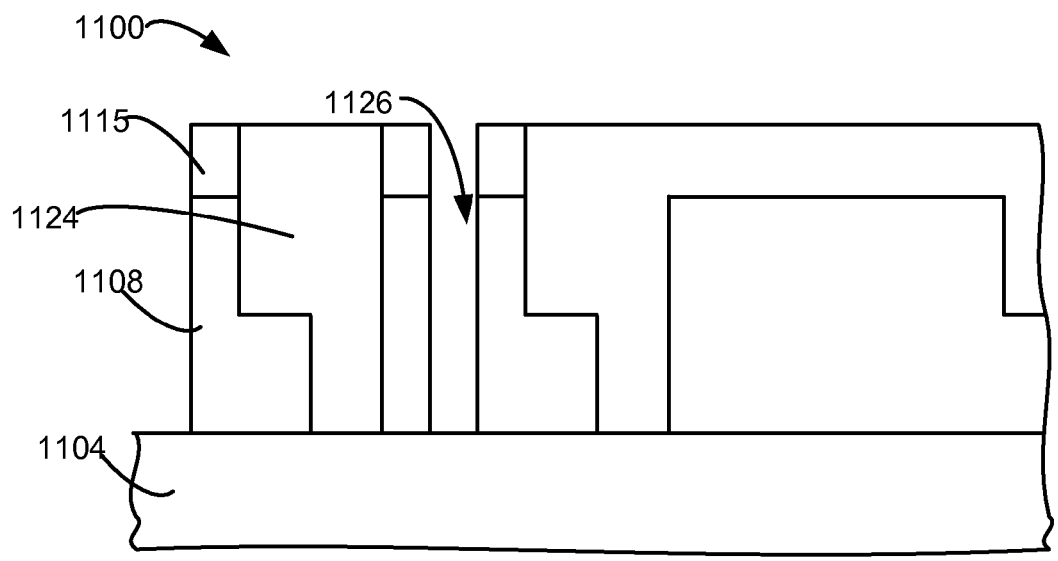

In another embodiment, after the features are etched into the dielectric layer 1108 (step 112), a mask 1124 is formed over the features, which covers the narrow spaces while exposing the wide spaces 1120, as shown in FIG. 11A. Preferably, the sacrificial material in the wide spaces is completely exposed, as shown in FIG. 11A. The dielectric layer 1108 is part of a stack formed by a sacrificial layer 1112 over the dielectric layer 1108 over a substrate 1104. The part of the sacrificial layer 1112 exposed by the opening in the mask 1124 is removed, as shown in FIG. 11B. The mask is removed and the filler material 1124 is provided, which fills the features and the part of the sacrificial layer that was removed. The remaining sacrificial layer is then removed, as shown in FIG. 11C. The spaces between the filler material are then shrunk (step 124) and gaps 1126 are etched into the dielectric layer (step 128), as shown in FIG. 11D. The filler material 1124 over the wide space prevents gaps from being etched into the dielectric layer 1108 at the wide space.

Figure 12A:
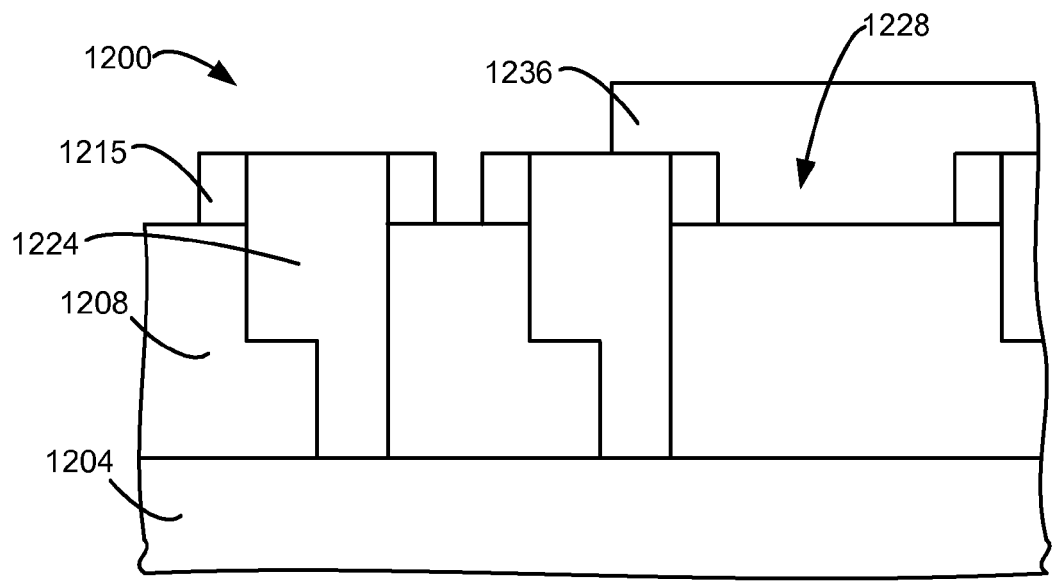
FIGS. 12A-B are schematic cross-sectional views of a stack with wide and narrow spaces in another embodiment of the invention.
Figure 12B:
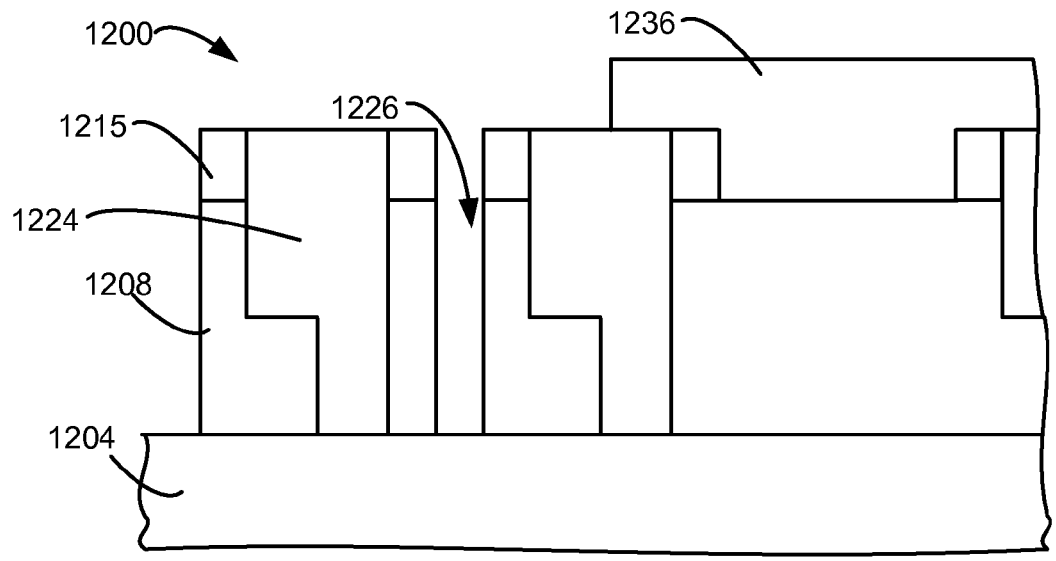

In another embodiment, after the spaces are shrunk (step 124) a mask 1236 is formed over the wide space 1228 of a stack 1200 but not over the narrow spaces, as shown in FIG. 12A. The gaps are etched into the dielectric layer 1208 over the substrate 1204 of the stack between sidewall shrink 1215 adjacent to filler material 1224, as shown in FIG. 12B. The mask 1236 prevents etching of the wide spaces, while gaps are etched in the narrow spaces.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. An apparatus for reducing capacitances between semiconductor devices for a dielectric layer over which a sacrificial layer has been placed, comprising:
 a plasma processing chamber, comprising:
  a chamber wall forming a plasma processing chamber enclosure;
  a substrate support for supporting a substrate within the plasma processing chamber enclosure;
  a pressure regulator for regulating the pressure in the plasma processing chamber enclosure;
  at least one electrode for providing power to the plasma processing chamber enclosure for sustaining a plasma;
  a gas inlet for providing gas into the plasma processing chamber enclosure; and
  a gas outlet for exhausting gas from the plasma processing chamber enclosure;
 a gas source in fluid connection with the gas inlet, comprising;
  a sacrificial layer etchant source;
  a dielectric layer etchant source;
  a shrink deposition gas source; and
  a shrink profile shaping gas source;
 a controller controllably connected to the gas source and the at least one electrode, comprising:
  at least one processor; and
  non-transitory computer readable media comprising:
   computer readable code for etching features into the sacrificial layer and dielectric layer, wherein the features are subsequently filled with a filler material;
   computer readable code for removing the sacrificial layer, so that parts of the filler material remain exposed above a surface of the dielectric layer, wherein spaces are between the exposed parts of the filler material;

computer readable code for shrinking widths of the spaces between parts of the filler material with a shrink providing a sidewall deposition comprising at least one cycle, wherein each cycle comprises:

computer readable code for providing a shrink deposition gas from the shrink deposition gas source;

computer readable code for generating a plasma from the shrink deposition gas;

computer readable code for stopping the shrink deposition gas from the shrink deposition gas source;

computer readable code for providing a shrink profile shaping gas from the shrink profile shaping gas source;

computer readable code for generating a plasma from the shrink profile shaping gas; and computer readable code for stopping the shrink profile shaping gas from the shrink profile shaping gas source;

computer readable code for etching gaps into the etch layer between contact structures through the sidewall deposition; and computer readable code for closing the gaps to form pockets in the gaps.

2. The apparatus, as recited in claim 1, wherein each gap has a volume and each pocket has a volume, wherein the volume of each pocket is at least half the volume of the gap in which the pocket is located.

3. The apparatus, as recited in claim 2, wherein the deposition gas comprises at least one of a hydrocarbon, fluorocarbon, and hydrofluorocarbon and the profile shaping gas comprises at least one of $C_xF_y$, $NF_3$, $C_xH_y$ and $C_xH_yF_z$.

4. The apparatus, as recited in claim 3, wherein the closing the gaps comprises a plurality of cycles, wherein each cycle comprises:

a bread loaf deposition phase; and
  a bread loaf profile shaping phase.

5. The apparatus, as recited in claim 4, wherein closing the gaps also removes the shrink sidewall deposition.

6. The apparatus, as recited in claim 5, wherein the shrinking the widths of the spaces shrinks the widths of the spaces by 5-80% and wherein the profile shaping phase shapes the shrink sidewall deposition to form vertical sidewalls.

7. The apparatus, as recited in claim 4, wherein the non-transitory computer readable media further comprises computer readable code for removing the filler material after closing the gap.

8. The apparatus, as recited in claim 1, wherein the deposition gas comprises at least one of a hydrocarbon, fluorocarbon, and hydrofluorocarbon and the profile shaping gas comprises at least one of $C_xF_y$, $NF_3$, $C_xH_y$ and $C_xH_yF_z$.

9. The apparatus, as recited in claim 1, wherein the closing the gaps comprises a plurality of cycles, wherein each cycle comprises:

a bread loaf deposition phase; and
  a bread loaf profile shaping phase.

10. The apparatus, as recited in claim 1, wherein closing the gaps also removes the shrink sidewall deposition.

11. The apparatus, as recited in claim 1, wherein the shrinking the widths of the spaces shrinks the widths of the spaces by 5-80% and wherein the profile shaping phase shapes the shrink sidewall deposition to form vertical sidewalls.

12. The apparatus, as recited in claim 1, wherein the non-transitory computer readable media further comprises computer readable code for removing the filler material after closing the gap.

* * * * *